United States Patent [19]

Kaplow et al.

[11] 4,162,174
[45] Jul. 24, 1979

[54] SOLAR CELL ARRAY

[75] Inventors: Roy Kaplow, Newton; Robert I. Frank, Lexington, both of Mass.

[73] Assignee: Massachusetts Institute of Technology, Cambridge, Mass.

[21] Appl. No.: 885,217

[22] Filed: Mar. 10, 1978

[51] Int. Cl.² ............................................... H01L 31/04
[52] U.S. Cl. ............................ 136/89 PC; 136/89 MS; 29/572
[58] Field of Search ............. 136/89 P, 89 PC, 89 AC

[56] References Cited
U.S. PATENT DOCUMENTS

| 3,653,971 | 4/1972 | Lidorenko et al. | 136/89 |
| 3,952,324 | 4/1976 | Wolff et al. | 357/19 |
| 3,994,012 | 11/1976 | Warner, Jr. | 357/30 |

Primary Examiner—Aaron Weisstuch
Attorney, Agent, or Firm—Hopgood, Calimafde, Kalil, Blaustein & Lieberman

[57] ABSTRACT

A semiconductor solar-cell array including a plurality of adjacent solar cell segments, each segment comprising a number of series-connected unit solar cells, and the series connected unit solar cells from each segment being electrically connected in parallel with the series-connected unit solar cells from other segments. Concentrated solar radiation is focused on the upper surface of the solar-cell array wherein the periphery of the focused image is contained within the upper surface area. The series-parallel connection of the unit solar cells and solar cell segments provides maximum utilization of incident solar radiation to thereby increase solar cell output. In addition, the series-parallel connection scheme allows the array to operate effectively without imposing stringent requirements as to solar-tracking precision in order to maintain the focused image at a fixed location on the upper surface of the cell.

13 Claims, 4 Drawing Figures

SOLAR CELL ARRAY

This invention relates to solar or photovoltaic cells for use in conjunction with a concentrated image of the sun, and, more particularly, to a solar cell array of series-connected elements utilizing parallel connection of groups of cell elements to maximize the usable output of the cell, under conditions of varying image registration with the exposure-sensitive surface of the cell.

Fossil fuels have in the past provided the bulk of the world's energy needs. However, as the price of fossil fuels has increased and their supplies decreased, increasing attention has been directed towards the development of alternate energy sources. One such energy source is the solar cell which directly converts the energy from the sun into usuable electrical power.

Solar cells have long been used in prior-art solar-energy systems. In these systems, the conventional or planar solar cell consists of a large area p-n junction formed in a wafer of monocrystalline material such as silicon. The junction is formed parallel to the upper surface of the cell, and this upper surface receives incident radiation from the sun which produces current flow across the p-n junction in a well known manner. These conventional or planar solar cells suffer from various disadvantages, including large series resistance, inefficient operation at high concentrations of incident light, and the fact that such cells produce a high-current, low-voltage output.

Solar cells having a number of series-connected elements have been developed in an attempt to circumvent some of the problems encountered with conventional or planar solar cells. One type of series-connected solar cell is illustrated in U.S. Pat. No. 3,422,527 granted to J. M. Gault on Jan. 21, 1969. This cell is fabricated from silicon wafers which have been appropriately doped to form P+ and n+ surface layers on opposite sides of the wafers, and the wafers are then stacked with sintered together with intervening metal layers. The wafers are sliced into segments to create a plurality of solar cells which are then orientated such that the p-n junctions are normal to the cell surface. The plurality of p-n junctions are effectively connected in series as a result of a sintering process during fabrication, to form a solar cell consisting of a number of series-connected p-n junctions. With silicon, the resultant series-connected solar cell has the potential for more efficient high-intensity operation, it provides a low series-resistance, and it also provides a high-voltage, low-current output which is desirable in many applications.

Series-connected solar cells are especially useful in high intensity applcations. In such high-intensity applications, the sun's image may be, for example, focused into an image incident on the active surface of the solar cell, but several problems are presented. More particularly, if the focused image is too small, then one or more of the series-connected p-n junctions will not be receiving incident light. A feature of series-connected cells is that current travels in series through the entire cell from a single incoming lead to a single outgoing lead and therefore if one or more of the p-n junctions are not receiving light, the entire cell does not conduct the series current. This results in the electrical output of the cell being essentially zero even though a majority of the cell's active area is receiving light. This problem is due to the fact that the amount of current which is generated by a series-connected cell is determined by the p-n junction which is collecting the least photo-generated current whether due to a poor junction or to a low or non-existent light level.

One way to solve this problem, and to ensure uniform illumination of a solar cell is to make the focused image large enough to cover the entire cell area. However, when this is done, in the circumstance of using a circular image and a rectangular solar cell, the cell area being illuminated is only two thirds of the area of the focused image required to illuminate the solar cell. Therefore, this results in approximtely thirty percent of the incident light being wasted, in that thirty percent of the incident light does not fall on the rectangular solar cell but falls adjacent to the cell and thus is not utilized in generating electricity.

In an attempt to match the geometry of the solar cell to the geometry of a circular image of focused radiation, the solar cell can be constructed such that the series-connected elements form a circle of approximately the same diameter as the diameter of the focused incident radiation. It can be readily appreciated that if the solar cell elements are configured in a circular arrangement, the center elements will be of maximum length, i.e., the diameter of the circle, while the end elements will approach zero length in order to achieve the circular configuration. Again, in a solar cell having series-connected elements, the maximum cell output is directly proportional to the length of each individual cell element. Therefore, as the length of the cell elements on either end of the circular cell approach zero length, the output current of the cell also approaches zero. Accordingly, the construction of a circular solar cell does not solve the problem mentioned above due to the fact that the circular arrangement results in a very low or non-existent cell output current which is, of course, an unsatisfactory solution to the problem. In addition, it can be appreciated that if an attempt is made to match the diameter of a circular cell to the diameter of the focused image, precise solar tracking must be utilized in order to ensure continuous illumination of the cell. Apparatus to accomplish precise solar tracking adds great additional expense to a workable solar cell system. It is to be understood, of course, that the problem defined above for a circular image and a rectangular cell also occurs with any cell formed from an arrangement of series-connected elements which the incident light area is less than the active area of the cell.

It is therefore an object of this invention to achieve maximum utilization of focused solar energy incident on a solar cell without requiring that the solar cell have a particular geometry.

It is a further object of this invention to provide maximum utilization of incident solar energy without the need for highly precise solar tracking apparatus.

It is a further object of the invention to fully utilize the maximum amount of focused solar energy in the form of a concentrated spot incident on a solar cell comprised of a number of series-connected elements.

It is a further object of this invention to provide a solar cell which will provide relatively large amounts of voltage and relatively small amounts of current without wasting focused incident solar radiation.

It is a further and general object of this invention to provide a solar cell which provides maximum utilization of incident solar radiation regardless of the image shape of the incident light, so long as the incident light lies within the light receiving area of the cell.

In accordance with one aspect of the invention, a semiconductor solar cell consists of a plurality of adjacent solar-cell segments, the solar cell having an upper surface adapted for exposure to concentrated solar radiation focused in an image on the upper surface of the solar cell.

It is a feature of the invention that each solar cell segment consists of a plurality of series-connected unit solar cells.

It is another feature of the invention that solar cell segments are electrically connected in parallel, thereby allowing each segment to function as a series-connected solar cell providing a high-voltage low-current output while the parallel connected segments provide maximum utilization of the active area of the cell.

It is another feature of the invention that the periphery of the image focused on the upper surface of the solar cell is completely contained within the upper surface area of the cell.

It is another feature of the invention that the solar cell segments may be formed from a common substrate and that unit solar cells within a particular segment are series-connected while adjacent solar cell segments are connected in parallel to provide maximum solar cell efficiency.

It is a further feature of the invention that the parallel connection of solar cell segments allows improved solar cell output without the need for precise solar tracking apparatus.

In accordance with another aspect of the invention a semi-conductor solar-cell array is formed from a plurality of adjacent cell portions connected to a common support structure wherein each portion comprises a plurality of adjacent parallel solar cell segments.

It is a feature of the invention that the parallel segments of at least one portion can be arranged perpendicular to the parallel segments of an adjacent portion.

It is another feature of the invention that each solar cell segment consists of a plurality of series-connected unit solar cells and that segments are electrically connected in parallel to provide maximum solar-cell output.

To the accomplishment of the above and to further objects that may hereinafter appear, the present invention relates to an improved solar cell as defined in the appended claims and as described in the following specification when considered in conjunction with the accompanying drawings, in which:

The embodiments of the invention described hereinbelow illustrate a solar-cell array which has an n-type silicon substrate. It is to be understood, however, that the solar cell of the invention may also be implemented with a substrate of p-type polarity. It will also be understood that other types of semi-conductor material may be employed and that a heterojunction as well as the homojunction structure described may be employed.

Figure 1:
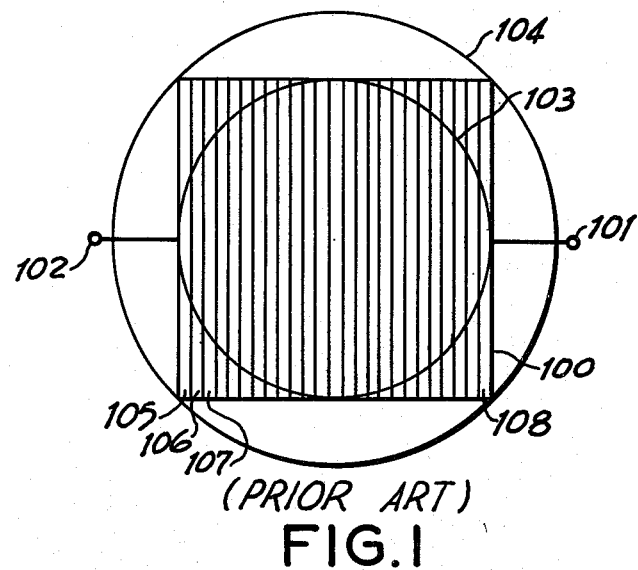
FIG. 1 illustrates a prior art series-connected vertical junction solar-cell array which has focused thereon incident radiation in the form of a circular image.

Refer to FIG. 1 wherein is illustrated a series-connected vertical junction solar cell such as the one described in U.S. Pat. No. 3,422,527. Although the discussion hereinafter is directed to a rectangular series-connected vertical junction solar cell, the invention here is not so limited and any solar cell consisting of series-connected elements is applicable to the inventive concept. Similarly, although the focused image is depicted as circular, an image of any geometry is also applicable.

The series-connected vertical junction solar cell consists of a pluraliy of unit solar cells such as unit cells 105 through 108 formed into rectangular array 100. Each unit cell contains one p-n junction. Electrical connection to the cell is schematically illustrated by terminals 101 and 102 which provide electrical connection to the cell, allowing the energy developed by the cell to be utilized. The upper surface of the solar cell is adapted for exposure to receive solar radiation, and the solar radiation is focused on the upper surface in the form of a circular image illustrated at 103. Image 103 is confined and arranged to be of a circumference which fits within the rectangular boundaries of the series-connected vertical junction solar cell. Restricting or confining the circumference of the circular image to fit within the surface area of the solar cell results in the end elements of the cell (i.e., elements 105 and 108) receiving only a limited amount of concentrated solar radiation. More particularly, it can be seen that element 105 is receiving effective incident radiation only in the area of terminal 102 and element 108 is receiving effective incident radiation only in the area of terminal 101. The series current traveling through the series-connected vertical junction solar cell is, of course, determined by the junction which is collecting the least photo-generated current. The junction elements at either end of the vertical junction solar cell are receiving only a limited amount of incident radiation and thus will pass a limited amount of photo-generated current. Therefore, the entire cell output is limited by the amount of incident radiation falling on the end elements and, as this incident radiation is limited, the output current of the cell is also limited in comparison to a cell having uniform illumination.

Uniform illumination of the rectangular solar cell array can be accomplished by increasing the circumference of the focused incident radiation such that the entire area of the rectangular solar-cell array is contained within the circumference of the focused image. A focused image of sufficient circumference to enclose the entire solar-cell array is illustrated at 104. Increasing the circumference of the focused image such that the entire solar-cell array is included within the circumference of the image provides more uniform illumination and thus provides increased cell output but at the same time the radiation which is not incident on the array is wasted. Standard geometric equations can be utilized to calculate the amount of lost radiation and such calculations reveal that the amount of radiation falling outside the cell is almost 30% of the total radiation incident on the circular image. Restricting the circumference of the circular image to be contained within the cell area results in reduced cell output, while increasing the circumference of the circular image to fully illuminate the cell results in wasted solar energy. Thus, when radiation is focused onto a rectangular solar cell in the form of a circular image, one is confronted with either limited cell output or wasted solar radiation. Either of these situations is, of course, undesirable. This same problem would, of course, exist with series-connected solar cells and images of different geometries where the image either does not fully illuminate the cell or where portions of the image fall outside the cell.

Figure 2:
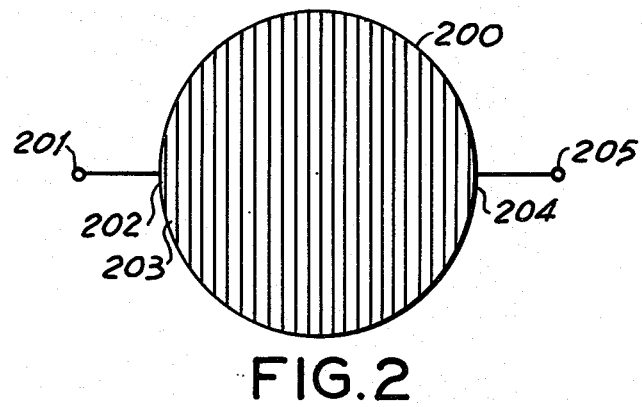
FIG. 2 illustrates a circular solar-cell array configuration.

FIG. 2 illustrates a series-connected vertical junction solar cell constructed in accordance with the teachings in U.S. Pat. No. 3,422,527, but geometrically configured to be circular in nature. Constructing a circular cell would appear to solve the problems described above in that the diameter of the circular solar cell can be arranged to match the diameter of the focused incident radiation. Matching the respective diameters results in maximum utilization of the incident radiation and thus solves one of the problems described above. However, as is illustrated in FIG. 2, the end elements of the circular solar cell, such as elements 202 and 204, approach zero length and thus restrict the output current of the solar cell. More particularly, the output energy of the cell is limited by the area of each individual unit cell and thus the entire solar cell output is limited by the area of end elements 202 and 204 adjacent to terminals 201 and 205. Accordingly, it can be seen that although the construction of a circular solar cell apparently makes better utilization of focused incident radiation, the problem is again encountered wherein cell output is severely limited. Therefore, the construction of a circular solar cell clearly results in an undesirable solution to the problems discussed above. In addition, the use of a circular cell requires highly precise tracking apparatus which adds unnecessary expense to a workable solar cell system.

Figure 3:
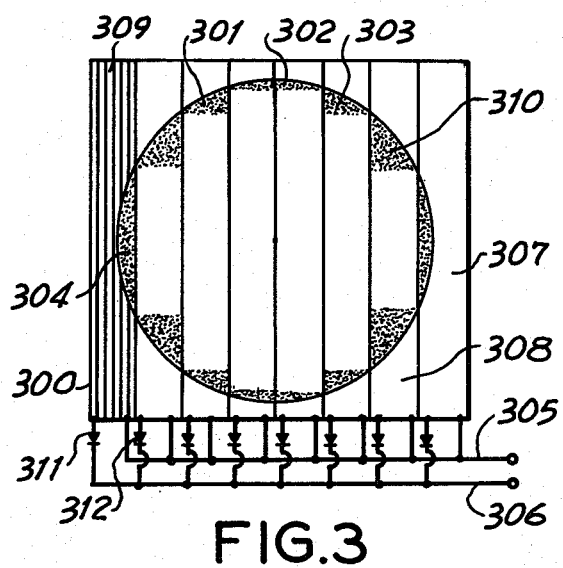
FIG. 3 illustrates the solar-cell array of the instant invention consisting of a plurality of solar cell segments, each segment contining a plurality of series-connected unit solar cells wherein each series-connected segment is electrically connected in parallel to adjacent segments.

Refer now to FIG. 3 which illustrates a solar cell constructed in accordance with the teachings of the instant invention. Solar cell 300 is comprised of a plurality of adjacent solar cell segments such as segments 307, 308 and 309. Each segment in turn consists of a plurality of unit solar cells, each of which produce an electrical output. The unit cells are series-connected such that each segment consists of a series-connected vertical junction solar cell such as the solar cell illustrated in U.S. Pat. No. 3,422,527. Alternatively, each solar cell segment could be constructed in accordance with the teachings set forth in our co-pending application Ser. No. 689,989, filed May 26, 1977, now U.S. Pat. No. 4,110,122, and entitled "High Intensity Solid State Solar Cell", which is incorporated herein by reference. The advantages of constructing the solar cell in FIG. 3 in accordance with the teachings of our co-pending application will be more fully described hereinafter.

Each series-connected solar cell segment has attached thereto external connections which extend from the unit solar cells, at each end of a solar cell segment, and connect to output terminals 305 and 306. Diodes 311 and 312 as well as the remaining diodes included in the external connections are utilized to ensure that current flow is in one direction, away from a particular segment. The diodes may be necessary in the situation wherein one segment is not illuminated, and thus not producing current, to ensure that current does not flow from an illuminated segment to an unilluminated segment, rather than to the external electrical load. It can be readily seen from FIG. 3 that the connections extending from each solar cell segment result in electrically connecting each segment in parallel with every other solar cell segment. Therefore, what is provided is a plurality of solar cell segments, each segment consisting of a number of series-connected unit solar cells, wherein each segment is connected in parallel with every other segment via terminals 305 and 306. Each series-connected segment provides a high-voltage low-current output, and the connection of the segments in parallel results in a completed solar cell which provides a relatively high voltage, moderate current output. The number of unit solar cells contained within a particular segment determines the output voltage of that segment.

The series connections within segments can be accomplished according to the teachings in U.S. Pat. No. 3,422,527, and the parallel connections between segments can be accomplished with external connections such as connections 305 and 306. However, it is advantageous to utilize the teachings in our co-pending application Ser. No. 689,989 (now U.S. Pat. No. 4,110,122), which illustrates a solar cell having a plurality of unit solar cells formed from a common substrate wherein the body material of each unit cell advantageously has the same positional relation in the finished cell as existed in the original substrate. Series connection of the unit cells within a particular segment and a technique for connecting the segments in parallel is illustrated in our co-pending application Ser. No. 796,657, filed May 13, 1977, and entitled "Method of Making A High Intensity Solid State Solar Cell" (U.S. Pat. No. 4,131,984). As is illustrated in said U.S. Pat. No. 4,131,984 co-pending application Ser. No. 796,657), series connections between various unit cells and series-parallel connections can be readily accomplished by selective etching techniques as are fully described in this application. The advantage of utilizing the teachings in these two applications to construct the cell of the instant invention is that each unit solar cell is formed from a common substrate, thus simplifying solar cell construction; also, with each construction, interconnections between unit cells, including series connections and parallel connections, may be formed on the rear surface of the cell, thus providing a compact solar cell without requiring external connection elements for subunits within the main cell.

Focused on the uppersurface of the solar cell in FIG. 3 is concentrated incident radiation, illustrated by circular image 310. It is to be understood that the focused image incident on the upper surface of the solar cell need not be circular but can be of any shape. In addition, although cell 300 is illustrated as rectangular, it can be of any shape. The periphery of circular image 310 is completely contained within the area of the upper surface of the cell. Shaded areas 301 through 304, within the periphery of the circular image are portions of solar cell segments which are not able to fully utilize the incident radiation. More particularly shaded areas 301 through 304 are portions of individual segments wherein incident radiation does not fully illuminate the entire segment and therefore the elements of a particular segment may not be receiving equal amounts of radiation. The output from series-connected p-n junctions is, of course, limited by the illumination which is incident on each individual junction and thus, when a particular series-connected element is not illuminated, or receives less illumination than other elements, the entire solar cell segment output is limited. Therefore, due to the fact that all portions of a particular segment are not equally illuminated and due to the fact that the output of a particular portion is limited by the element receiving the least illumination, the illuminated portion within the shaded area does not fully contribute to cell output.

The non-shaded areas within periphery 310 illustrate the areas of the solar cell which are actively contributing to the output of the solar cell. The non-shaded areas are contributing due to the fact that incident radiation extends across a complete solar cell segment within the non-shaded areas and therefore that particular portion of the solar cell segment contributes to cell output.

The existence of the shaded areas within the periphery of the focused radiation illustrates that the entire cell area within the periphery is not utilized to provide cell output. Therefore, it is clear that the cell illustrated in FIG. 3 does not operate at 100% of its possible output potential. However, it can be illustrated that the cell configuration in FIG. 3 has a much greater relative cell output than the prior art cell configuration discussed above. More particularly, the ratio of active energy producing area to inactive shaded area, in percent, can be calculated for various ratios of image radius to segment width. It is clear from the configuration shown in FIG. 3 that the ratio of active area to inactive area will change as the focused image is moved across the area of the entire solar cell. For example, if the image is adjacent to the extreme right side of the solar cell, element 309 may be completely unilluminated and thus will contribute nothing to cell output. Similarly, when the image is adjacent to the extreme left edge of the solar cell various ones of the segments on the right edge of the solar cell will not be illuminated and thus will not contribute to cell output. However, the cell continues to produce a usable output regardless of the position of the focused image, due to the parallel connection of the cell segments. This illustrates that the cell of the instant invention can be used without precise solar tracking apparatus due to the fact that the focused image can change position on the surface of the cell without terminating cell output.

Through use of standard geometric equations, calculations can be performed to determine the ratio of active area to total area within the periphery of the focused incident light and this ratio, in percent, indicates the relative output of the cell of the instant invention when compared to cells having the same efficiency and when under uniform illumination. A high ratio of active area to total area means a greater cell output when converting sunlight to electricity. This cell output will vary depending on relative size of image diameter and segment width, i.e., the ratio of image radius to segment width, and will also vary depending on the position of the focused image on the solar cell. The following table gives various values of cell output ratios for different ratios of image radius to segment width. Two output values, a maximum and a minimum, are given for each ratio of image radius to segment width. The maximum rating indicates the relative output for the best possible position of the image on the solar cell and the minimum rating indicates the relative output for the worst possible position of the image on the solar cell.

| Ratio of Image Radius To Segment Width | Relative Output | |
|---|---|---|
| | Maximum (Best Position) | Minimum (Worst Position) |
| 4:1 | 85.6% | 79.5% |
| 6:1 | 90.2% | 86.9% |
| 8:1 | 92.6% | 90.4% |
| 10:1 | 94.0% | 92.5% |
| 20:1 | 97.0% | 96.4% |

The above table illustrates the maximum and minimum relative poutput ratings for various ratios of image radius to segment width. More particularly, when the image radius is four times as large as the segment width, the maximum cell relative output is 85.6% which corresponds to the image being positioned in the best possible location on the solar cell such that inactive areas are minimized. Similarly, the minimum relative output is 79.5% which corresponds to the image being positioned in the worst possible position on the cell such that inactive areas are at a maximum. The remaining figures in the table illustrate various maximum and minimun relative output ratings for various ratios of image radius to segment width. The table illustrates that with a ratio of image radius to segment width of 20:1, the cell is operating at 97% relative output with the image located in the best possible location on the cell area. With the same ratio the minimum relative output of the cell is 96.4%. This is to be contrasted with the prior art cell in FIG. 1 wherein when the circumference of the image was limited to fall within the area of the cell, cell output was at a minimum or zero. Similarly, when the circumference of the incident radiation was expanded to uniformly illuminate the cell approximately 30% of the incident radiation was wasted. In the cell of the instant invention, however, with a 4:1 ratio of image radius to segment width, the maximum amount of wasted radiation, corresponding to the worst possible position of the image on the cell, is only 100% minus 79.5% or 20.5%. Moreover, when the ratio of image radius to segment width is 20:1 the maximum amount of radiation wasted is 100% minus 96.4% or 3.6% wasted radiation as compared to approximately 30% wasted radiation in the prior art cell of FIG. 1.

What has been illustrated therefore is an advantageous arrangement of a solar cell which maximizes the utilization of incident radiation focused in an image on the cell. Maximum utilization is accomplished by dividing the cell into segments consisting of a number of series-connected unit solar cells and connecting each separate segment in parallel with every other segment. Therefore, each segment provides a high voltage, low current output while the parallel-connected segments making up the entire cell, provide a relatively high voltage, moderate current output thus allowing efficient utilization of the energy produced by the cell. More importantly, the periphery of the circular image can be varied in accordance with the ratios given above and the periphery of the image is restricted such that the entire image is completely contained within the area of the upper surface of the cell to provide maximum utilization of incident radiation. Advantageously, however, restricting the periphery of the focused image to be contained within the area of the upper surface of the cell does not result in limited output due to the fact that there is a plurality of series-connected segments which are further connected in parallel, to allow maximum cell output even though the image does not completely illuminate the entire solar cell.

Figure 4:
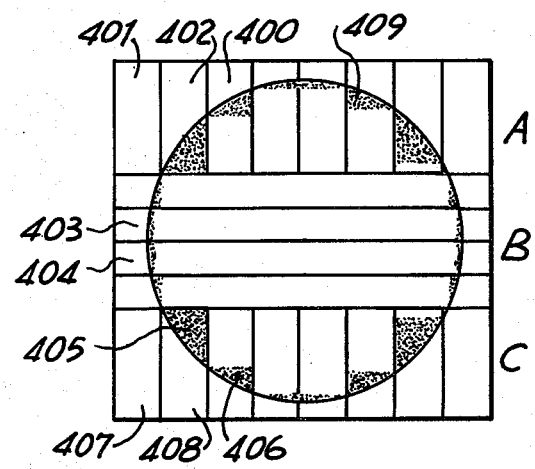
FIG. 4 illustrates an additional geometric configuration in accordance with the instant invention.

Refer to FIG. 4 wherein is illustrated another possible cell geometry to provide improved utiliation of incident solar radiation. Solar cells of the type illustrated in FIG. 4 are not necessarily constructed from a common substrate but are constructed from three separate portions, namely, portions A, B, and C, each of which can be constructed from a common substrate and thereafter the portions can be connected to a common support structure to provide the cell geometry shown in FIG. 4. Each portion in FIG. 4 consists of a plurality of spaced, parallel segments and each segment consists of a number of series-connected unit solar cells as has been discussed above in accordance with FIG. 3. Not shown are the interconnections for the various segments, but each segment of series-connected unit cells will be understood to be connected in parallel with every other segment within a particular portion. Each portion is thereafter connected in parallel with the remaining portions to provide the total cell output. Therefore, each segment such as segment 400, 401 and 402 in portion A consists of series-connected unit solar cells, and each segment is connected in parallel with other segments. Similarly, segments 403 and 404 in portion B consist of series-connected unit solar cells, and each segment is connected in parallel with other segments. This same connection arrangement also applies to portion C and segments 406 through 408. Shaded areas 405 and 406, as well as the remaining shaded areas, illustrate areas within image 409 which do not contribute to cell output in accordance with the teachings discussed above in referring to FIG. 3.

Utilizing the geometry illustrated in FIG. 4, it is possible to obtain a maximum relative output rating of 95.2% with a ratio of image radius to segment width of 8:1. Therefore, the geometry shown in FIG. 4 provides improved cell output when the circular image is in the best possible position on the solar cell. However, the geometry shown in FIG. 4 has a minimum relative output rating of 88% which is less than the rating of the geometry in FIG. 3 when utilizing a ratio of image radius to segment width of 8:1 and positioning the circular image at the worst possible location on the cell. What FIG. 4 illustrates therefore, is that various geometries are possible to maximize the output of the cell when the image is in the best possible location but these geometries may reduce the minimum output of the cell when the image is in the worst possible location. It is to be understood that various other configurations of cell and image geometry, other than those shown in FIG. 3 and FIG. 4 are possible to achieve other relative output ratings. Regardless of the configuration used, in each case the cell is formed from a number of segments where each segment consists of a number of series-connected unit solar cells. The segments are then connected in parallel to provide a total cell output of relatively high voltage and moderate current. Finally, the series-parallel connections achieve maximum utilization of focused incident radiation, an achievement not accomplished in the prior art.

Exemplary cell dimensions for the cells described above are 0.01 millimeter center spacing between each cell element with approximately 100 unit solar cells being included in a particular segment. Image radius for a circular image is approximately 2.5 centimeters.

It will be appreciated that modifications may be made in the embodiment of the invention hereinabove specifically described without necessarily departing from the spirit and scope of the invention.

What is claimed is:

1. A semiconductor solar-cell array in combination with means providing a confined concentration of solar radiation on the radiation exposure surfaces of said solar cell array, wherein the area of confined concentration may shift to the extent that tracking mechanism may fail to keep the cell array in continuous precise alignment with the sun, said array comprising a plurality of adjacent solar-cell segments having said radiation-exposure surfaces in a common geometrical surface positioned in said area of confined concentration, the collective overall area of said exposure surfaces being greater than said area of confined concentration, each of said segments comprising a plurality of like series-connected solar-cell units, each of which cell units produces an electrical output upon solar-radiation exposure, and electrical connecting means establishing parallel connection of said segments.

2. A semiconductor solar cell array in accordance with claim 1, wherein adjacent solar cell segments are formed from a common substrate.

3. A semiconductor solar-cell array in accordance with claim 1, wherein said area of confined concentration is a focused generally circular image of the sun.

4. A semiconductor solar-cell array in accordance with claim 3, wherein the solar-cell segments are elongate and rectangular, whereby, a portion of the solar-cell segments is not contained within the periphery of the image and therefore does not contribute to solar-cell output, the area of said non-contributing portion being related to the ratio of the radius of the circular image to the segment width, said ratio being at least substantially 4:1.

5. A semiconductor solar-cell in accordance with claim 4, wherein said ratio is at least substantially 10:1, whereby variations in cell output, resulting from the position of the image on the upper surfaces of the adjacent solar-cell segments, are reduced.

6. The semiconductor solar-cell array of claim 3, wherein the collective overall area of said exposure surfaces is generally square, the sides of the square being of length at least equal to the diameter of the circular image of the sun.

7. The semiconductor solar-cell array of claim 6, in which said sides exceed the diameter of the circular image of the sun.

8. The semiconductor solar-cell array of claim 7, in which said segments are of substantially equal width which is a relatively small fraction of the length of a square side, the amount by which the sides of the square are outside the focused area being less than said segment width when the focused area is centered on the square.

9. The semiconductor solar-cell array of claim 6, in which said solar-cell segments are rectangular, of length equal to a side of said square, and disposed in side-by-side adjacency.

10. The semiconductor solar-cell array of claim 6, in which said solar-cell segments are rectangular, some of said segments being of length equal to a side of said square, and disposed in side-by-side adjacency in the central region parallel to and between opposite sides of the square, remaining solar-cell segments being of lesser length but in side-by-side adjacency and oriented perpendicular to those of the central region, said remaining solar-cell segments being the respective regions between said central region and the adjacent perimeter confines of the overall collective generally square area.

11. A semiconductor solar-cell array in accordance with claim 1, wherein solar-cell segments are generally rectangular and arranged in parallel and disposed into solar-cell groups, each cell group being positioned adjacent to another cell group, all cell groups being mounted on a common support structure, and the parallel solar-cell segments within one cell group being generally perpendicular to the parallel solar-cell segments of an adjacent cell group.

12. A method for constructing a semiconductor solar-cell including the steps of assembling a plurality of parallel-disposed series-connected unit solar cells formed from a common substrate into an elongate rectangular solar-cell segment, each unit solar cell providing an electrical output, arranging a number of said segments in side-by-side parallel adjacency to each other such that the upper surfaces of adjacent segments form a collective generally square surface adapted for exposure to receive incident radiation focused in a circular image on said upper surface, the sides of the square being of at least the length of the diameter of the focused circular image of the sun, and electrically connecting the series-connected unit solar cells from one segment in parallel with the series-connected unit solar cells from adjacent segments.

13. A method for constructing a semiconductor solar cell in accordance with claim 12, further including the steps of placing adjacent segments in parallel with each other, and grouping the parallel segments into adjacent cell groups wherein the parallel segments of at least one cell group are arranged perpendicular to the parallel segments of an adjacent cell group.

* * * * *